United States Patent
Su

(10) Patent No.: US 10,354,906 B2
(45) Date of Patent: Jul. 16, 2019

(54) SUPPORT APPARATUS AND SUPPORT METHOD

(71) Applicants: BOE Technology Group Co., Ltd., Beijing (CN); Hefei Xinsheng Optoelectronics Technology Co., Ltd., Hefei (CN)

(72) Inventor: Chih-Wei Su, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 110 days.

(21) Appl. No.: 15/558,378

(22) PCT Filed: Mar. 2, 2017

(86) PCT No.: PCT/CN2017/075450
§ 371 (c)(1),
(2) Date: Sep. 14, 2017

(87) PCT Pub. No.: WO2017/202097
PCT Pub. Date: Nov. 30, 2017

(65) Prior Publication Data
US 2018/0096876 A1   Apr. 5, 2018

(30) Foreign Application Priority Data
May 27, 2016   (CN) .......................... 2016 1 0365366

(51) Int. Cl.
*H01L 21/00* (2006.01)
*H01L 21/683* (2006.01)
(Continued)

(52) U.S. Cl.
CPC ...... *H01L 21/6835* (2013.01); *H01L 21/6734* (2013.01); *H01L 21/67346* (2013.01);
(Continued)

(58) Field of Classification Search
CPC ........... H01L 21/6734; H01L 21/67346; H01L 21/683; H01L 21/6835; H01L 21/687;
(Continued)

(56) References Cited

U.S. PATENT DOCUMENTS

2005/0223986 A1* 10/2005 Choi .................... C23C 16/4405
118/715
2014/0332147 A1* 11/2014 Nakamura .............. B32B 37/10
156/228
2016/0372343 A1   12/2016 Wang et al.

FOREIGN PATENT DOCUMENTS

CN   104617017 A   5/2015
CN   105575863 A   5/2016
(Continued)

OTHER PUBLICATIONS

Sep. 10, 2018—(CN) Second Office Action Appn 201610365366.8 with English Translation.
(Continued)

*Primary Examiner* — Brook Kebede
(74) *Attorney, Agent, or Firm* — Banner & Witcoff, Ltd.

(57) ABSTRACT

A support apparatus and a support method are provided, the support apparatus includes: a support substrate for bearing a supported component, the support substrate having a first main surface facing the supported component and a second main surface positioned on a side opposite to the first main surface; and a pressure distribution plate, arranged on the first main surface of the support substrate and positioned between the support substrate and the supported component, wherein the pressure distribution plate is configured to bring the supported component to be separated from the support substrate.

20 Claims, 6 Drawing Sheets

(51) Int. Cl.
    *H01L 21/673*     (2006.01)
    *H01L 21/687*     (2006.01)

(52) U.S. Cl.
    CPC .............................. *H01L 21/6875* (2013.01); *H01L 2221/68318* (2013.01); *H01L 2221/68381* (2013.01)

(58) Field of Classification Search
    CPC ... H01L 21/6875; G03F 7/70691; G03F 7/707
    USPC ........................................................ 438/464
    See application file for complete search history.

(56) References Cited

FOREIGN PATENT DOCUMENTS

| | | |
|---|---|---|
| CN | 105810628 A | 7/2016 |
| CN | 105845609 A | 8/2016 |
| EP | 1174910 A2 | 1/2002 |
| WO | 2009089248 A2 | 7/2009 |

OTHER PUBLICATIONS

Jun. 12, 2017—(WO) International Search Report and Written Opinion Appn PCT/CN2017/075450 with English Tran.
Dec. 25, 2017—(CN) First Office Action Appn 201610365366.8 with English Tran.

\* cited by examiner

SUPPORT APPARATUS AND SUPPORT METHOD

The application is a U.S. National Phase Entry of International Application No. PCT/CN2017/075450 filed on Mar. 2, 2017, designating the United States of America and claiming priority to Chinese Patent Application No. 201610365366.8 filed on May 27, 2016. The present application claims priority to and the benefit of the above-identified applications and the above-identified applications are incorporated by reference herein in their entirety.

TECHNICAL FIELD

Embodiments of the present disclosure relate to a support apparatus and a support method.

BACKGROUND

In the preparation process of a display substrate, various treatments, e.g., evaporation deposition, sputtering and the like, need to be carried out on the display substrate. During the various treatments are carried out, the display substrate generally is supported by a support substrate. After the treatments are finished, the support substrate and the display substrate are conveyed to a separation chamber together, and the display substrate is jacked up by a lifting pin base so as to separate the display substrate from the support substrate. In the separating process, due to a small contact area of the display substrate and a lifting pin of the lifting pin base, the display substrate bears a pressure at a position where the display substrate is in contact with the lifting pin, such that the display substrate is easy to be damaged and product defects are caused, and particularly for a large-sized display substrate, a severe deformation may be caused.

SUMMARY

According to embodiments of the disclosure, a support apparatus is provided. The support apparatus comprises: a support substrate, for bearing a supported component, the support substrate having a first main surface facing the supported component and a second main surface positioned on a side opposite to the first main surface; and a pressure distribution plate, arranged on the first main surface of the support substrate and positioned between the support substrate and the supported component, wherein the pressure distribution plate is configured to bring the supported component to be separated from the support substrate.

For example, the support substrate is provided with a first through hole running through the first main surface and the second main surface in a thickness direction of the support substrate; the support apparatus further comprises a separation device, the separation device including a first protrusion; and the first protrusion is configured to pass through the first through hole and jack up the pressure distribution plate.

For example, a positioning element and/or a binding element, which corresponds to the first through hole in position, is arranged on a surface of the pressure distribution plate facing the support substrate.

For example, the positioning element is a blind hole extending from a side of the pressure distribution plate facing the support substrate to a side of the pressure distribution plate away from the support substrate.

For example, another binding element is arranged on the first protrusion; and in the process that the first protrusion jacks up the pressure distribution plate, the binding element of the pressure distribution plate and the another binding element of the first protrusion binds with each other, so that the first protrusion and the pressure distribution plate are fixed to each other.

For example, the binding element of the pressure distribution plate and the another binding element of the first protrusion bind with each other by a magnetic adsorption force.

For example, a support element is arranged on the first main surface of the support substrate, and the support element supports the supported component.

For example, the support element is provided with an adhering portion, and the adhering portion adheres the supported component to the support substrate.

For example, a height of the support element in a direction from the support substrate to the supported component is greater than a thickness of the pressure distribution plate.

For example, a first fixing element is arranged on the first main surface of the support substrate; a second fixing element, which corresponds to the first fixing element in position, is arranged on a surface of the pressure distribution plate, which faces the support substrate; and the first fixing element and the second fixing element bind with each other to fix the pressure distribution plate to the support substrate.

For example, the first fixing element and the second fixing element bind with each other by a magnetic adsorption force.

For example, the support substrate is provided with a second through hole running through the first main surface and the second main surface; the pressure distribution plate is provided with a through hole corresponding to the second through hole in position; the support apparatus further comprises a transfer device, the transfer device including a second protrusion; and the second protrusion is configured to pass through the second through hole of the support substrate and the through hole of the pressure distribution plate.

For example, the second protrusion includes an adsorption element arranged at an end portion of the second protrusion.

According to the embodiments of the disclosure, a support method is provided. The method comprises: providing a support substrate for bearing a supported component, the support substrate having a first main surface facing the supported component and a second main surface positioned on a side opposite to the first main surface; providing a pressure distribution plate arranged on the first main surface of the support substrate and positioned between the support substrate and the supported component; and moving the pressure distribution plate towards a direction away from the support substrate so as to bring the supported component to be separated from the support substrate.

For example, the support substrate is provided with a first through hole running through the first main surface and the second main surface in a thickness direction of the support substrate. The moving the pressure distribution plate towards the direction away from the support substrate so as to bring the supported component to be separated from the support substrate includes: providing a separation device, the separation device including a first protrusion; and moving the first protrusion to pass through the first through hole and jack up the pressure distribution plate, so that the pressure distribution plate brings the supported component to be separated from the support substrate.

For example, a positioning element and/or a binding element, which corresponds to the first through hole in position, is arranged on a surface of the pressure distribution plate facing the support substrate; and the first protrusion, after passing through the first through hole, binds with the pressure distribution plate by the positioning element and/or the binding element, so that in the process that the first protrusion jacks up the pressure distribution plate, the first protrusion and the pressure distribution plate are fixed to each other.

For example, the support substrate is provided with a second through hole running through the first main surface and the second main surface; the pressure distribution plate is provided with a through hole corresponding to the second through hole in position; and the support method further comprising: providing a transfer device, the transfer device including a second protrusion; and placing the supported component on the second protrusion after the second protrusion passes through the second through hole of the support substrate and the through hole of the pressure distribution plate, and then moving the second protrusion so as to move the supported component placed on the second protrusion onto the support substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 1b is a schematic sectional view taken in a direction A-A1 in FIG. 1a;

FIG. 4b is a schematic side view of FIG. 4a;

FIG. 6b is a schematic sectional view taken in a direction C-C1 in FIG. 6a;

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

In one aspect, embodiments of the present disclosure provide a support apparatus, and the support apparatus includes: a support substrate for bearing a supported component, the support substrate having a first main surface facing the supported component and a second main surface positioned on a side opposite to the first main surface; and a pressure distribution plate arranged on the first main surface of the support substrate and positioned between the support substrate and the supported component. The pressure distribution plate is configured to bring the supported component to be separated from the support substrate. For example, in the process of separating the supported component from the support substrate, the pressure distribution plate moves towards a direction away from the support substrate to bring the supported component to be separated from the support substrate. In the support apparatus according to the embodiments of the present disclosure, by arranging the pressure distribution plate, damage to the supported component in the process of separating the supported component from the support substrate can be avoided, and product yield is improved; and for example, in the case that an external force is applied to separate the supported component from the support substrate, the external force is directly applied to the pressure distribution plate instead of being directly applied to the supported component so as to avoid damage to the supported component. For example, the supported component is a display substrate; in this case, by arranging the pressure distribution plate, damage to the display substrate in the process of separating the display substrate from the support substrate can be avoided, product yield is improved, and particularly for a large-sized display substrate, deformation of the display substrate, which is generated during the display substrate is separated from the support substrate, can be greatly reduced.

The support apparatus according to the embodiments of the present disclosure will be described in detail below in connection with the drawings.

Figure 1A:
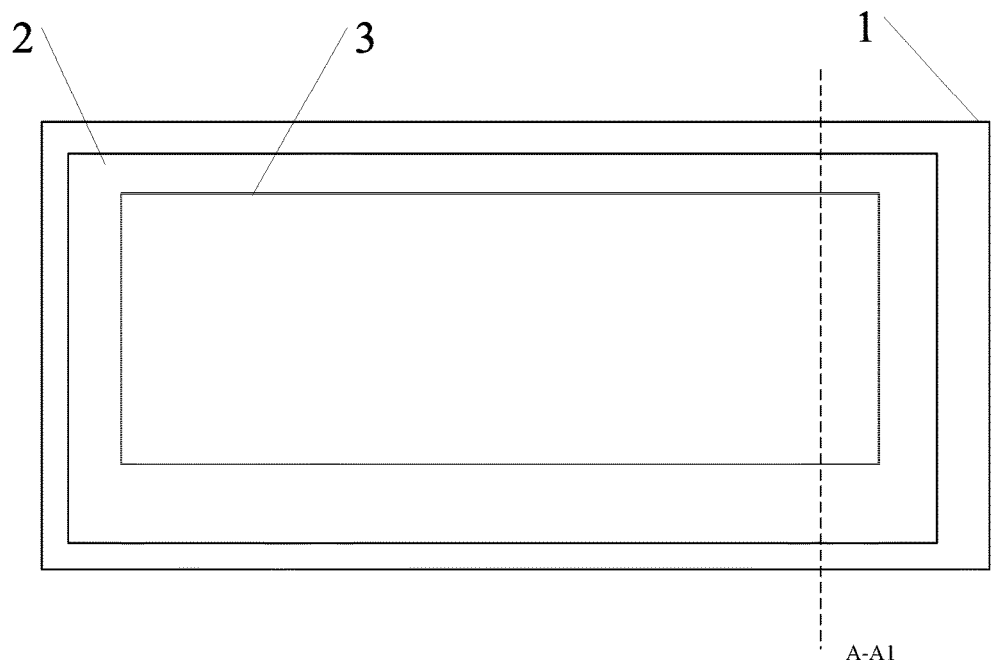
FIG. 1a is a schematic top view of a support apparatus according to embodiments of the present disclosure.
Figure 1B:
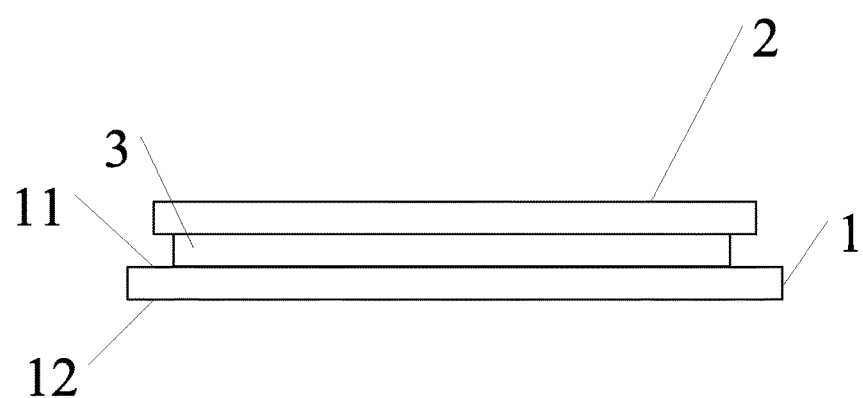

FIG. 1a is a schematic top view (in this drawing, the supported component shields the pressure distribution plate, and in order to illustrate the pressure distribution plate, the supported component is shown with transparency) of the support apparatus according to the embodiments of the present disclosure; and FIG. 1b is a schematic sectional view taken in a direction A-A1 in FIG. 1a. With reference to FIG. 1a and FIG. 1b, the support apparatus includes: the support substrate 1, the support substrate having the first main surface 11 facing the supported component 2 and the second main surface 12 positioned on the side opposite to the first main surface 11; and the pressure distribution plate 3, the pressure distribution plate 3 being arranged on the first main surface 11 of the support substrate 1 and positioned between the support substrate 1 and the supported component 2. During the supported component 2 is separated from the support substrate 1, the pressure distribution plate 3 moves towards the direction away from the support substrate 1 so as to bring the supported component 2 to be separated from the support substrate 1. For example, the pressure distribution plate is clamped by a manipulator, and the pressure distribution plate 3 is bring to move towards the side away from the support substrate. For example, the pressure distribution plate is jacked up by a jacking mechanism from a side of the pressure distribution plate 3 close to the support substrate 1.

Figure 2A:
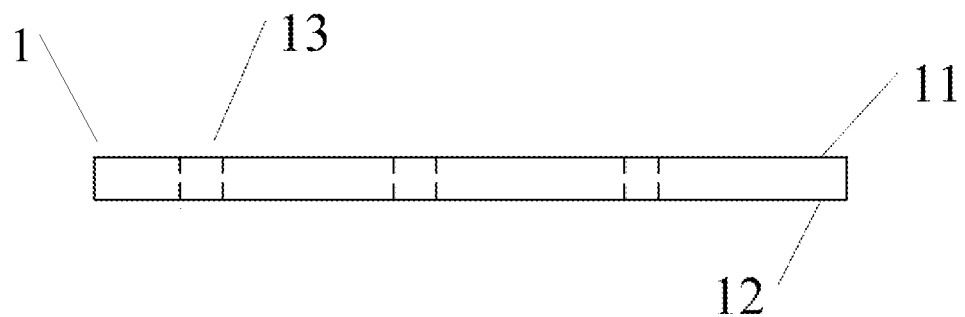
FIG. 2a is a structural schematic view of a support substrate with a first through hole according to the embodiments of the present disclosure.
Figure 2B:
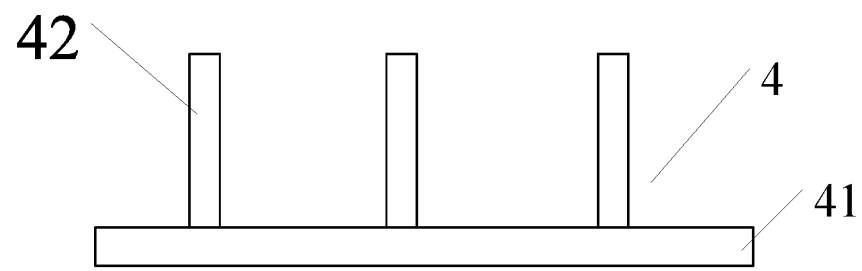
FIG. 2b is a structural schematic view of a separation device according to the embodiments of the present disclosure.

For example, with reference to FIG. 2a, the support substrate 1 is provided with a first through hole 13 running through the first main surface 11 and the second main surface 12 in a thickness direction of the support substrate 1. With reference to FIG. 2b, the support apparatus further includes a separation device 4, and the separation device 4 includes a first protrusion 42. In the process of separating the supported component 2 from the support substrate 1, the first protrusion 42 passes through the first through hole 13 and presses against the pressure distribution plate 3 to jack up the pressure distribution plate 3, so that the pressure distribution plate 3 brings the supported component 2 to be separated from the support substrate 1. For example, the separation device 4 further includes a first base 41, and the first protrusion 42 is arranged on the first base 41.

It should be noted that specific structures of the first base 41 and the first protrusion 42 are not limited to the structures in the drawing, as long as the first protrusion 42 can be guaranteed to pass through the first through hole 13 and jack up the pressure distribution plate 3 and the supported component 2 positioned on the pressure distribution plate 3. For example, after the first protrusion 42 passes through the first through hole 13, a portion of the first protrusion 42 protruding from the first through hole 13 presses against the pressure distribution plate 3 so as to bring the pressure distribution plate 3 to separate the supported component from the support substrate. Therefore, a length of the first protrusion 42, for example, is greater than a depth of the first through hole 13. For example, the first base 41 is of a plate-shaped structure, and the first protrusion 42 is perpendicularly arranged on a surface of the first base 41, which faces the support substrate 1, and corresponds to the first through hole 13 on the support substrate 1. For example, the first through hole 13 is perpendicularly arranged along the thickness direction of the support substrate 1. By perpendicularly arranging the first protrusion and the first through hole, reliability of the separation process can be improved, and damage to the substrate can be avoided.

Figure 3:
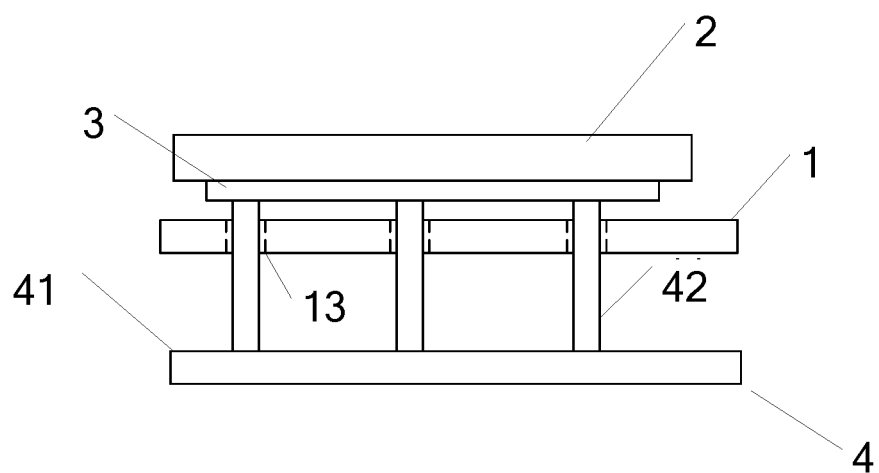
FIG. 3 is a schematic view of separating a supported component from the support substrate according to the embodiments of the present disclosure.

FIG. 3 shows a schematic view of separating the supported component from the support substrate. As shown in FIG. 3, the separation device 4 is moved along a direction towards the support substrate 1, so that the first protrusion 42 of the separation device 4 passes through the first through hole 13 and contacts with the pressure distribution plate 3; then the separation device 4 is continuously moved and the pressure distribution plate 3 is jacked up, so that the pressure distribution plate 3 brings the supported component 2 positioned thereon to move so as to enable the supported component 2 and the support substrate 1 to be separated from each other. For example, as shown in FIG. 3, there are a plurality of the first protrusions 42, there are a plurality of the first through holes 13, and the first protrusions 42 and the first through holes 13 correspond to each other one to one. By arranging the pressure distribution plate 3, a force bearing point can be positioned on the pressure distribution plate 3 so as to avoid damage caused by a case that the supported component 2 suffers a force directly. After the supported component 2 and the support substrate 1 are separated from each other, the supported component 2 for example is conveyed to a next process by a conveyor device (e.g., a manipulator), and the separation device 4 moves along a direction away from the support substrate 1 to enable the first protrusion 42 to exit the first through hole 13 and rearrange the pressure distribution plate 3 on the support substrate 1.

For example, a positioning element 31 and/or a binding element 32, which corresponds to the first through hole 13 in position, is arranged on a surface of the pressure distribution plate 3 facing the support substrate 1, so that after the first protrusion 42 passes through the first through hole 13, positioning of the first protrusion 42 can be carried out by the positioning element 31 and/or the binding element 32, thereby preventing relative movement between the first protrusion 41 and the pressure distribution plate 3 in the process of separating the supported component 2 from the support substrate 1 and ensuring stability of separation.

Figure 4A:
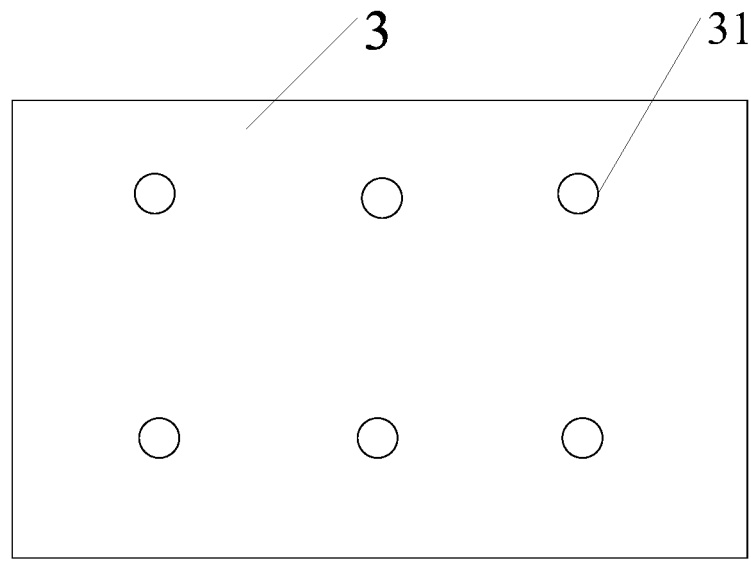
FIG. 4a is a schematic top view of a pressure distribution plate with a blind hole according to the embodiments of the present disclosure.
Figure 4B:
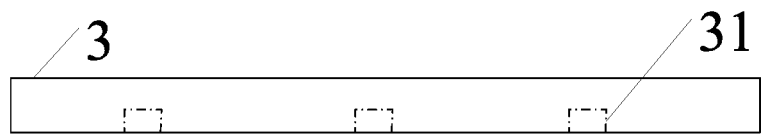

For example, with reference to FIG. 4a and FIG. 4b, the positioning element 31 is a blind hole extending from a surface of the pressure distribution plate 3 facing the support substrate 1 toward a surface of the pressure distribution plate 3 away from the support substrate 1. The "blind hole" means a hole extending from the surface of the pressure distribution plate 3 facing the support substrate 1 toward the surface of the pressure distribution plate 3 away from the support substrate 1 without passing through the pressure distribution plate 3. By arranging the blind hole, for example, the first protrusion 41 of the separation device 4 presses against the blind hole after passing through the first through hole 13 to avoid relative movement between the first protrusion 41 and the pressure distribution plate 3 so as to improve stability of the separation process. It should be noted that in FIG. 4a and FIG. 4b, two rows of positioning blind holes of which the number is six in total are shown, but the embodiments of the present disclosure are not limited thereto. For example, a number and positions of the blind holes correspond to a number and positions of the first through holes. For example, the positioning elements 31 correspond to the first protrusions 41 (or, the first through holes 13) one to one, that is, the blind holes correspond to the first protrusions 41 (or, the first through holes 13) one to one.

Figure 5A:
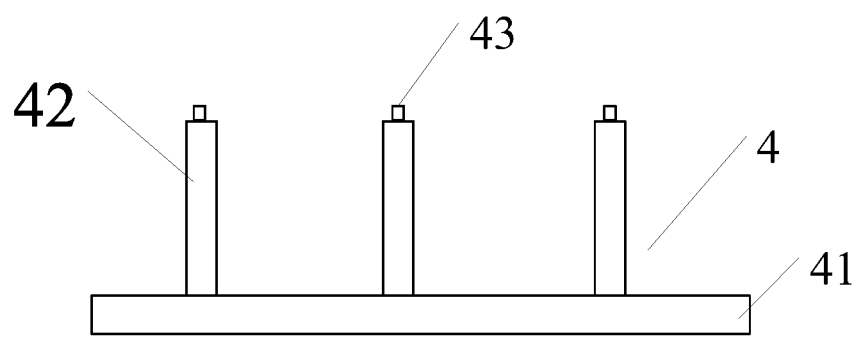
FIG. 5a is a schematic view of a first protrusion with another binding element according to the embodiments of the present disclosure.
Figure 5B:
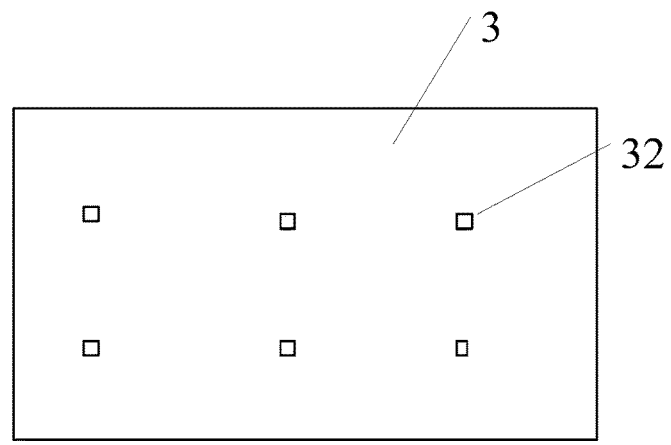
FIG. 5b is a schematic view of the pressure distribution plate with a binding element according to the embodiments of the present disclosure.

For example, with reference to FIG. 5a and FIG. 5b, another binding element 43 is arranged on the first protrusion 42. In the process that the first protrusion 42 jacks up the pressure distribution plate 3, the binding element 32 of the pressure distribution plate 3 binds with the another binding element 43 on the first protrusion 42, so that the first protrusion 42 and the pressure distribution plate 3 are fixed to each other, thereby ensuring stability of separation. For example, a plurality of the binding elements 32 are provided, a plurality of the another binding elements 43 are provided, and the binding elements 32 of the pressure distribution plate 3 correspond to the binding elements 43 on the first protrusion portions 42 one to one.

For example, the binding element 31 on the pressure distribution plate 3 and the another binding element 43 on the first protrusion 42 bind with each other by a magnetic adsorption force, so that the first protrusion 42 and the pressure distribution plate 3 can be easily separated during the first protrusion 42 exits the first through hole 13. For example, the another binding element 43 on the first protrusion 42 is a magnet, and the binding element 32 on the pressure distribution plate 3 is a ferromagnetic material; or the binding element 32 on the pressure distribution plate 3 is a magnet, and the another binding element 43 on the first protrusion 42 is a ferromagnetic material; or the another binding element 43 on the first protrusion 42 and the binding element 32 on the pressure distribution plate 3 are magnets attracting each other, i.e., at least portions of the another binding element 43 and the binding element 32, which contact with each other, are opposite in magnetism. By enabling the another binding element 43 on the first protrusion 42 and the binding element 32 on the pressure distribution plate 3 to bind with each other by the magnetic adsorption force, the separation process of the supported component and the support substrate can be more stable.

For example, both the positioning element 31 and the binding element 32 are arranged on the pressure distribution plate 3. Further, for example, the blind hole 31 is formed on the pressure distribution plate 3, and meanwhile, the magnet or the ferromagnetic material is arranged at the bottom of the blind hole 31; and correspondingly, the another binding element 43 on the first protrusion 42 is set as the ferromagnetic material or the magnet, so that the first protrusion 42 is limited in the blind hole and is adsorbed to the pressure distribution plate by the magnetic force after passing through the first through hole 13, thereby further improving stability of the separation process. In other words, a positioning effect of the positioning element and a binding effect of the binding element are simultaneously achieved, so that the process of separating the supported component from the support substrate is more stable.

Figure 6A:
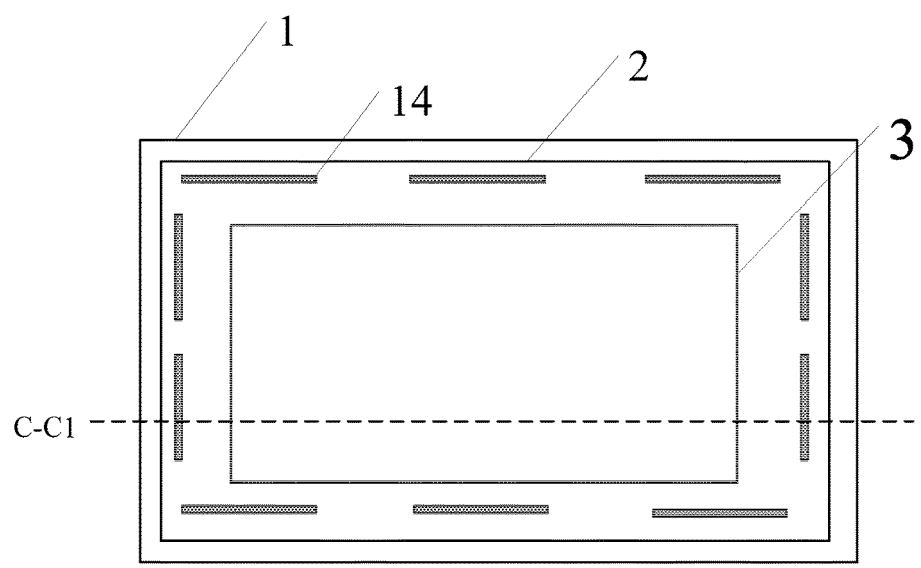
FIG. 6a is a schematic top view of the support substrate with a support element according to the embodiments of the present disclosure.

For example, a support element is arranged on the first main surface of the support substrate, and the support element supports the supported component. With reference to FIG. 6a, the support element 14 is arranged on the first main surface 11 of the support substrate 1. The support element 14, for example, is uniformly arranged along the edge of the support substrate 1.

For example, the support element is provided with an adhering portion, and the adhering portion adheres the supported component to the support substrate. For example, the adhering portion is arranged at a side of the support element 14, which is away from the first main surface 11. By arranging the adhering portion, the supported component is more firmly arranged on the support substrate.

Figure 6B:
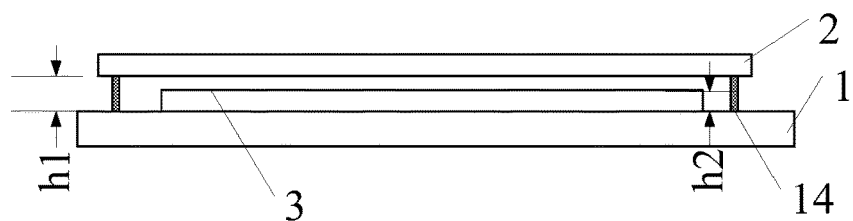

For example, a height of the support element in a direction from the support substrate to the supported component is greater than a thickness of the pressure distribution plate. FIG. 6b is a schematic sectional view of the support apparatus according to the embodiments of the present disclosure, in which the support element is arranged on the support substrate. With reference to FIG. 6b, a height h1 of the support element 14 in the direction from the support substrate 1 to the supported component 2 is greater than a thickness h2 of the pressure distribution plate 3. In other words, the height of the support element 14 in a thickness direction of the support substrate 1 is greater than a thickness of the pressure distribution plate 3, so that the supported component 2 is placed on the support element 14 during the support substrate 1 bears the supported component. For example, as shown in FIG. 6b, during the support substrate 1 bears the supported component, the supported component 2 does not contact with the pressure distribution plate 3.

Figure 7A:
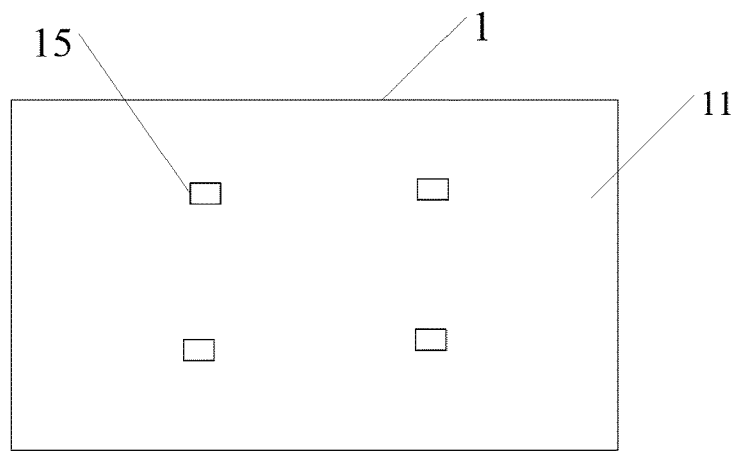
FIG. 7a is a schematic top view of the support substrate with a first fixing element according to the embodiments of the present disclosure.
Figure 7B:
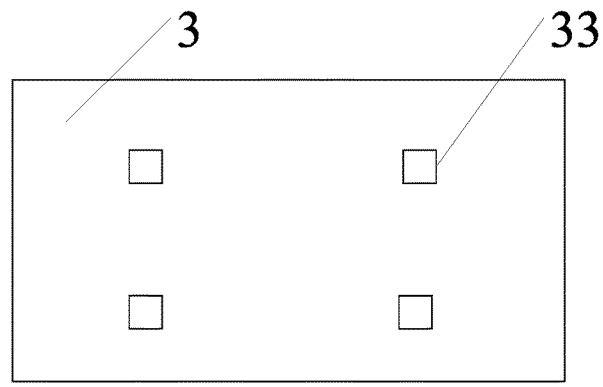
FIG. 7b is a schematic top view of the pressure distribution plate with a second fixing element according to the embodiments of the present disclosure.

For example, with reference to FIG. 7a and FIG. 7b, a first fixing element 15 is arranged on the first main surface 11 of the support substrate 1; a second fixing element 33, which corresponds to the first fixing element 15 in position, is arranged on the surface of the pressure distribution plate 3 facing the support substrate 1; and the first fixing element 15 and the second fixing element 33 bind with each other to fix the pressure distribution plate 3 to the support substrate.

For example, the first fixing element 15 and the second fixing element 33 bind with each other by a magnetic adsorption force, so that the pressure distribution plate 3 and the support substrate 1 can be easily separated. For example, the first fixing element 15 is a ferromagnetic material, and the second fixing element 33 is a magnet; or the first fixing element 15 is a magnet, and the second fixing element 33 is a ferromagnetic material; or the first fixing element 15 and the second fixing element 33 are magnets attracting each other, i.e., at least portions of the first fixing element 15 and the second fixing element 33, which contact with each other, are opposite in magnet polarity. By enabling the pressure distribution plate 3 and the support substrate 1 to bind with each other by the first fixing element 15 and the second fixing element 33, the pressure distribution plate 3 and the support substrate 1 are fixed to each other during the pressure distribution plate 3 is placed on the support substrate 1. In addition, in a case that the first fixing element 15 and the second fixing element 33 bind with each other by the magnetic adsorption force, the pressure distribution plate 3 and the support substrate can be easily separated in the separation process.

Figure 8:
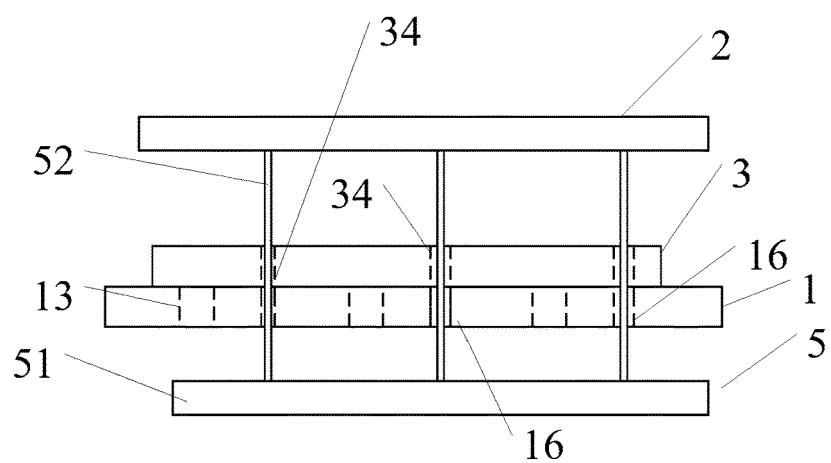
FIG. 8 is a schematic view of transferring the supported component to the support substrate by a transfer device according to the embodiments of the present disclosure.

For example, with reference to FIG. 8, the support substrate 1 is further provided with a second through hole 16 running through the first main surface and the second main surface; the pressure distribution plate 3 is provided with a through hole 34 corresponding to the second through hole 16 in position; and the support apparatus further comprises a transfer device 5, and the transfer device 5 includes a second protrusion 52. With reference to FIG. 8, in the process of placing the supported component 2 on the support substrate 1, the second protrusion 52 of the transfer device 5 passes through the second through hole 16 of the support substrate 1 and the through hole 34 of the pressure distribution plate 3, the supported component 2 is placed on the second protrusion 52, and then the second protrusion 52 is controlled to move downwards to bring the supported component 2 onto the support substrate 1. After the supported component 2 is moved onto the support substrate 1, the second protrusion 52 is continuously moved downwards so as to exit the second through hole 16 of the support substrate 1 and the through hole 34 of the pressure distribution plate 3. For example, the transfer device 5 further includes a second base 51, and the second protrusion 52 is arranged on the second base 51.

For example, the second base 51 is of a plate-shaped structure, and the second protrusion 52 is arranged on a surface of the plate-shaped structure, which faces the support substrate 1. The second protrusion 52 corresponds to the through hole 34 of the pressure distribution plate 3 and the second through hole 16 of the support substrate 1 in position. The second protrusion 52 passes through both the second through hole 16 of the support substrate 1 and the through hole 34 of the pressure distribution plate 3, i.e., a length of the second protrusion portion 52 is greater than a sum of a depth of the second through hole 16 of the support substrate 1 and a depth of the through hole 34 of the pressure distribution plate 3, so that after the second protrusion 52 passes through the second through hole 16 of the support substrate 1 and the through hole 34 of the pressure distribution plate 3, the supported component 2 is moved onto the support substrate 1. With further reference to FIG. 8, for example, the second through hole 16 of the support substrate 1 is perpendicularly formed along the thickness direction of the support substrate 1; for example, the through hole 34 of the pressure distribution plate 3 is perpendicularly formed along the thickness direction of the pressure distribution plate 3; for example, the second protrusion 42 is arranged perpendicularly on the second base 51, so that the second protrusion 42 can more easily pass through the second through hole 16 of the support substrate 1 and the through hole 34 of the pressure distribution plate 3, thereby transferring the supported component 2 onto the support substrate 1.

For example, the second protrusion 52 includes an adsorption element arranged at an end portion of the second protrusion 52. The adsorption element, for example, is a vacuum adsorption head so as to effectively adsorb the supported component (e.g., the display substrate) and move the supported component onto the support substrate.

Figure 9:
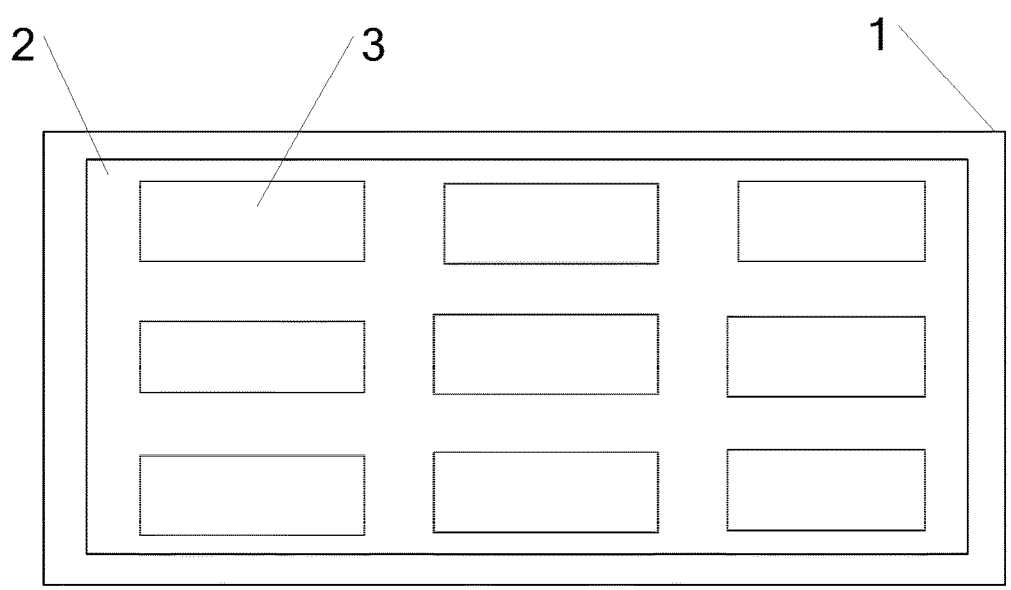
FIG. 9 is a schematic top view of the support substrate with a plurality of pressure distribution plates according to the embodiments of the present disclosure.

It should be noted that, for example, one or more of the pressure distribution plates are arranged between the supported component and the support substrate; in other words, for one supported component, one or more pressure distribution plates may be arranged. With reference to FIG. 9, for example, a plurality of the pressure distribution plates are uniformly arranged on the first main surface of the support substrate (six pressure distribution plates are shown in the drawing). The embodiments of the present disclosure do not limit the number of the pressure distribution plates.

In another aspect, the embodiments of the present disclosure provide a support method, and the support method includes: providing a support substrate and a pressure distribution plate, the support substrate having a first main surface facing a supported component and a second main surface positioned on a side opposite to the first main surface, wherein the pressure distribution plate is arranged on the first main surface of the support substrate and the supported component is arranged above the pressure distribution plate; and moving the pressure distribution plate towards a direction away from the support substrate so as to bring the supported component to be separated from the support substrate.

For example, the support substrate is provided with the first through hole running through the first main surface and the second main surface in a thickness direction of the support substrate; and the moving the pressure distribution plate towards the direction away from the support substrate so as to bring the supported component to be separated from the support substrate includes: providing the separation device, the separation device including the first protrusion; and moving the first protrusion to pass through the first through hole and press against the pressure distribution plate to jack up the pressure distribution plate, so that the pressure distribution plate brings the supported component to be separated from the support substrate.

For example, the positioning element and/or the binding element, which corresponds to the first through hole in position, is arranged on a surface of the pressure distribution plate facing the support substrate; and the first protrusion, after passing through the first through hole, binds with the pressure distribution plate by the positioning element and/or the binding element, so that in the process that the first protrusion jacks up the pressure distribution plate, the first protrusion and the pressure distribution plate are fixed to each other. By arranging the positioning element and/or the binding element on the pressure distribution plate to correspond to the first protrusion, the separation process of the supported component and the support substrate can be more stable.

For example, the positioning element is a blind hole extending from the side of the pressure distribution plate, which faces the support substrate, to the side of the pressure distribution plate, which is away from the support substrate. For example, the first protrusion presses against the blind hole after passing through the first through hole of the support substrate so as to avoid relative movement between the first protrusion and the pressure distribution plate in the separation process, thereby further improving stability of the separation process.

For example, the another binding element is arranged on the first protrusion; and the binding element on the pressure distribution plate binds with the another binding element on the first protrusion, so that in the process that the first protrusion jacks up the pressure distribution plate, the first protrusion and the pressure distribution plate are fixed to each other. By arranging the binding element on the pressure distribution plate and the another binding element on the first protrusion, an effect that the first protrusion and the pressure distribution plate are fixed to each other can be better, and stability of the separation process is improved.

For example, the binding element on the pressure distribution plate binds with the another binding element on the first protrusion by a magnetic adsorption force. The pressure distribution plate binds with the first protrusion in a mode of attracting each other by the magnetic adsorption force, so that not only is the structure simple, but also mutual positioning of the pressure distribution plate and the first protrusion can be rapidly implemented, and separation efficiency is improved.

For example, a support element is arranged on the first main surface of the support substrate, and the support element supports the supported component.

For example, the support element is provided with the adhering portion, and the adhering portion adheres the supported component to the support substrate. By arranging the adhering portion on the support element, the supported component can be stably placed on the support substrate.

For example, the height of the support element in the direction from the support substrate to the supported component is greater than the thickness of the pressure distribution plate. By setting the height of the support element and the thickness of the pressure distribution plate, the supported component is supported by the support element during the support substrate bears the supported component.

For example, the support substrate is provided with the second through hole running through the first main surface and the second main surface; the pressure distribution plate is provided with the through hole corresponding to the second through hole in position; and the support method further includes: providing the transfer device, the transfer device including the second protrusion; and placing the supported component on the second protrusion after the second protrusion passes through the second through hole of the support substrate and the through hole of the pressure distribution plate, and then moving the second protrusion so as to move the supported component placed on the second protrusion onto the support substrate.

In addition, various modifications above related to structures of the pressure distribution plate and the support substrate of the support apparatus may be adopted in the support method according to the embodiments of the present disclosure, and have corresponding technical effects. The embodiments of the present disclosure do not repeat herein.

In this specification, terms like "first", "second" are only used to differentiate one entity or operation from another, but are not necessarily used to indicate any practical relationship or order between those entities or operations. Terms such as "include" and "comprise" are open-ended expressions, not exclusive of a case that the included processes, methods and objects also have other elements. It should also be explained that directional or positional relationships shown by terms such as "upper", "lower" are directional or positional relationships shown as in the drawings, which only means to facilitate description of the invention and simplify the description, but do not indicate or imply that the devices or components must have specific directions, or be constructed or operated in the specific directions, and are not limitative of the invention. Unless expressly stipulated or defined, terms "mounted", "connected" and "linked" should be broadly understood, for example, they may be fixedly connected, detachably connected, or integrally connected; may be mechanically connected or electrically connected; or may be directly connected, indirectly connected by a medium, or internally communicated between two components. For those skilled in the art, specific meanings of the words in the present disclosure can be understood according to the actual conditions.

The foregoing embodiments merely are exemplary embodiments of the disclosure, and not intended to define the scope of the disclosure, and the scope of the disclosure is determined by the appended claims.

The present application claims priority of the Chinese Patent Application No. 201610365366.8 filed on May 27, 2016, the disclosure of which are incorporated herein by its reference in its entirety as part of the present application.

The invention claimed is:

1. A support apparatus, comprising:
   a support substrate, for bearing a supported component, the support substrate having a first main surface facing the supported component and a second main surface positioned on a side opposite to the first main surface; and
   a pressure distribution plate, arranged on the first main surface of the support substrate and positioned between the support substrate and the supported component,
   wherein the pressure distribution plate is configured to bring the supported component to be separated from the support substrate.

2. The support apparatus according to claim 1, wherein
   the support substrate is provided with a first through hole running through the first main surface and the second main surface in a thickness direction of the support substrate;
   the support apparatus further comprises a separation device, the separation device including a first protrusion; and
   the first protrusion is configured to pass through the first through hole and jack up the pressure distribution plate.

3. The support apparatus according to claim 2, wherein a positioning element and/or a binding element, which corresponds to the first through hole in position, is arranged on a surface of the pressure distribution plate facing the support substrate.

4. The support apparatus according to claim 3, wherein the positioning element is a blind hole extending from a side of the pressure distribution plate facing the support substrate to a side of the pressure distribution plate away from the support substrate.

5. The support apparatus according to claim 4, wherein the blind hole does not pass through the pressure distribution plate.

6. The support apparatus according to claim 3, wherein another binding element is arranged on the first protrusion; and in the process that the first protrusion jacks up the pressure distribution plate, the binding element of the pressure distribution plate and the another binding element of the first protrusion binds with each other, so that the first protrusion and the pressure distribution plate are fixed to each other.

7. The support apparatus according to claim 6, wherein the binding element of the pressure distribution plate and the another binding element of the first protrusion bind with each other by a magnetic adsorption force.

8. The support apparatus according to claim 1, wherein a support element is arranged on the first main surface of the support substrate, and the support element supports the supported component.

9. The support apparatus according to claim 8, wherein the support element is provided with an adhering portion, and the adhering portion adheres the supported component to the support substrate.

10. The support apparatus according to claim 8, wherein a height of the support element in a direction from the support substrate to the supported component is greater than a thickness of the pressure distribution plate.

11. The support apparatus according to claim 10, wherein during the support substrate bears the supported component, the supported component does not contact with the pressure distribution plate.

12. The support apparatus according to claim 1, wherein
    a first fixing element is arranged on the first main surface of the support substrate;
    a second fixing element, which corresponds to the first fixing element in position, is arranged on a surface of the pressure distribution plate, which faces the support substrate; and
    the first fixing element and the second fixing element bind with each other to fix the pressure distribution plate to the support substrate.

13. The support apparatus according to claim 12, wherein the first fixing element and the second fixing element bind with each other by a magnetic adsorption force.

14. The support apparatus according to claim 1, wherein
    the support substrate is provided with a second through hole running through the first main surface and the second main surface;
    the pressure distribution plate is provided with a through hole corresponding to the second through hole in position;
    the support apparatus further comprises a transfer device, the transfer device including a second protrusion; and
    the second protrusion is configured to pass through the second through hole of the support substrate and the through hole of the pressure distribution plate.

15. The support apparatus according to claim 14, wherein the second protrusion includes an adsorption element arranged at an end portion of the second protrusion.

16. The support apparatus according to claim 1, wherein for one supported component, one or more pressure distribution plates are arranged.

17. A support method, comprising:
    providing a support substrate for bearing a supported component, the support substrate having a first main surface facing the supported component and a second main surface positioned on a side opposite to the first main surface;
    providing a pressure distribution plate arranged on the first main surface of the support substrate and positioned between the support substrate and the supported component; and moving the pressure distribution plate towards a direction away from the support substrate so as to bring the supported component to be separated from the support substrate.

18. The support method according to claim 17, wherein the support substrate is provided with a first through hole running through the first main surface and the second main surface in a thickness direction of the support substrate; and
the moving the pressure distribution plate towards the direction away from the support substrate so as to bring the supported component to be separated from the support substrate includes:
providing a separation device, the separation device including a first protrusion; and
moving the first protrusion to pass through the first through hole and jack up the pressure distribution plate, so that the pressure distribution plate brings the supported component to be separated from the support substrate.

19. The support method according to claim 18, wherein a positioning element and/or a binding element, which corresponds to the first through hole in position, is arranged on a surface of the pressure distribution plate facing the support substrate; and the first protrusion, after passing through the first through hole, binds with the pressure distribution plate by the positioning element and/or the binding element, so that in the process that the first protrusion jacks up the pressure distribution plate, the first protrusion and the pressure distribution plate are fixed to each other.

20. The support method according to claim 17, wherein the support substrate is provided with a second through hole running through the first main surface and the second main surface;
the pressure distribution plate is provided with a through hole corresponding to the second through hole in position; and
the support method further comprising:
providing a transfer device, the transfer device including a second protrusion; and
placing the supported component on the second protrusion after the second protrusion passes through the second through hole of the support substrate and the through hole of the pressure distribution plate, and then moving the second protrusion so as to move the supported component placed on the second protrusion onto the support substrate.

* * * * *